United States Patent
Lim et al.

(10) Patent No.: US 9,397,248 B2
(45) Date of Patent: Jul. 19, 2016

(54) SILICON SOLAR CELL

(71) Applicant: Electronics and Telecommunications Research Institute, Daejeon (KR)

(72) Inventors: JungWook Lim, Daejeon (KR); Sun Jin Yun, Daejeon (KR); Seong Hyun Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 95 days.

(21) Appl. No.: 14/291,146

(22) Filed: May 30, 2014

(65) Prior Publication Data
US 2015/0129036 A1    May 14, 2015

(30) Foreign Application Priority Data

Nov. 11, 2013    (KR) .................. 10-2013-0136387

(51) Int. Cl.
| | | |
|---|---|---|
| H01L 31/02 | (2006.01) | |
| H01L 31/054 | (2014.01) | |
| H01L 31/0376 | (2006.01) | |
| H01L 31/06 | (2012.01) | |
| H01L 31/056 | (2014.01) | |

(52) U.S. Cl.
CPC ...... *H01L 31/0549* (2014.12); *H01L 31/03762* (2013.01); *H01L 31/056* (2014.12); *H01L 31/06* (2013.01); *Y02E 10/52* (2013.01)

(58) Field of Classification Search
CPC ............ H01L 31/0232; H01L 31/0224; H01L 31/02168; H01L 31/0328; H01L 31/18
USPC .................... 257/40, 458, E31.043
See application file for complete search history.

(56) References Cited

U.S. PATENT DOCUMENTS

| | | | | |
|---|---|---|---|---|
| 4,598,306 A | * | 7/1986 | Nath et al. ............. | 257/458 |
| 4,891,330 A | * | 1/1990 | Guha et al. ............. | 438/488 |
| 2009/0165850 A1 | | 7/2009 | Saita et al. | |
| 2010/0071751 A1 | | 3/2010 | Kim et al. | |

(Continued)

FOREIGN PATENT DOCUMENTS

| | | |
|---|---|---|
| EP | 2256839 A2 | 12/2010 |
| KR | 10-2012-00496504 A | 5/2012 |

OTHER PUBLICATIONS

Simon Kirner, et al., "An improved silicon—oxide-based intermediate-reflector for micromorph solar cells", Phys. Status Solidi C, vol. 9, No. 10-11, pp. 2145-2148, Sep. 27, 2012.

*Primary Examiner* — Michael Lebentritt
(74) *Attorney, Agent, or Firm* — Rabin & Berdo, P.C.

(57) ABSTRACT

A solar cell includes a first electrode; a lower light absorption layer disposed on the first electrode; an upper light absorption layer disposed on the lower light absorption layer; and an intermediate reflector layer provided between the lower light absorption layer and the upper light absorption layer, the intermediate reflector layer being comprised of copper oxide. The intermediate reflector layer includes a plurality of copper oxide layers including a lower copper oxide layer making contact with the lower light absorption layer, an upper copper oxide layer making contact with the upper light absorption layer, and an intermediate copper oxide layer provided between the lower copper oxide layer and the upper copper oxide layer. The plurality of copper oxide layers have respective oxygen amounts that gradually increase from the upper copper oxide layer to the lower copper oxide layer.

6 Claims, 3 Drawing Sheets

(56) References Cited

U.S. PATENT DOCUMENTS

| | | | |
|---|---|---|---|
| 2011/0174370 A1* | 7/2011 | Tsai | 136/256 |
| 2012/0097227 A1* | 4/2012 | Lim et al. | 136/255 |
| 2013/0284251 A1* | 10/2013 | Krasnov et al. | 136/256 |
| 2014/0238479 A1* | 8/2014 | Lim et al. | 136/256 |
| 2014/0239271 A1* | 8/2014 | Leem et al. | 257/40 |
| 2014/0239278 A1* | 8/2014 | Park et al. | 257/40 |
| 2015/0053262 A1* | 2/2015 | Lim et al. | 136/256 |

* cited by examiner

SILICON SOLAR CELL

CROSS-REFERENCE TO RELATED APPLICATIONS

This U.S. non-provisional patent application claims priority under 35 U.S.C. §119 of Korean Patent Application No. 10-2013-0136387, filed on Nov. 11, 2013, the entire contents of which are hereby incorporated by reference.

BACKGROUND

The present disclosure herein relates to a silicon solar cell, and more particularly, to a silicon solar cell including an intermediate reflector layer.

A silicon thin film-based solar cell has advantages of the abundance of silicon materials, the diversity of substrate materials and thermal stability. In addition, the generation of electricity in outdoors and indoors regardless of external environment is possible. However, the silicon thin film-based solar cell has disadvantages of having lower optical conversion efficiency when compared to a crystalline silicon solar cell.

To overcome the above-described limitations, a silicon solar cell including a plurality of stacked light absorption layers having different band gaps (for example, amorphous silicon-microcrystalline silicon or amorphous silicon-amorphous silicon germanium) in series has been fabricated. The silicon solar cell is provided with an intermediate reflector layer between the light absorption layers. The intermediate reflector layer effectively reflects light toward an upper light absorption layer and transmits light toward a lower light absorption layer to improve the efficiency of the silicon solar cell.

SUMMARY

The present disclosure provides a silicon solar cell having high efficiency.

The object of the inventive concept should not be construed as limited to an object set forth herein. Rather, other objects not set forth herein will be precisely understood to those skilled in the art from the following.

Embodiments of the inventive concept provide solar cells including a first electrode, a lower light absorption layer disposed on the first electrode, an upper light absorption layer disposed on the lower light absorption layer, and an intermediate reflector layer provided between the lower light absorption layer and the upper light absorption layer. The intermediate reflector layer includes copper oxide.

In some embodiments, the copper oxide may include CuO, $Cu_2O$ or $CuO_x$. Wherein x may be a real number from 0.1 to 2.

In other embodiments, the intermediate reflector layer may include a first intermediate reflector layer and a second reflector layer sequentially stacked on the lower light absorption layer. The second intermediate reflector layer may include the copper oxide.

In still other embodiments, the first intermediate reflector layer may include silicon (Si), silicon germanium (SiGe), silicon oxide ($SiO_x$), silicon carbide ($SiC_x$), silicon nitride ($SiN_x$), zinc oxide (ZnO), indium tin oxide (ITO), ZnO:Ga, ZnO:Al, copper (Cu), aluminum (Al), and silver (Ag).

In even other embodiments, the intermediate reflector layer may have a thickness from about 1 angstrom to about 100 nm.

In yet other embodiments, the intermediate reflector layer may reflect light having a short wavelength so that the upper light absorption layer may re-absorb transmitted light having the short wavelength through the upper light absorption layer, and the intermediate reflector layer may selectively transmit light having a long wavelength so as to provide the light having the long wavelength to the lower light absorption layer.

In further embodiments, the intermediate reflector layer may include a plurality of copper oxide layers.

In still further embodiments, the copper oxide layers may have different oxygen amounts.

In even further embodiments, the copper oxide layers may include a lower copper oxide layer making contact with the lower light absorption layer, an upper copper oxide layer making contact with the upper light absorption layer, and an intermediate copper oxide layer between the lower copper oxide layer and the upper copper oxide layer. Oxygen amount may gradually increase from the upper copper oxide layer to the lower copper oxide layer.

In yet further embodiments, the copper oxide layers may include a lower copper oxide layer making contact with the lower light absorption layer, an upper copper oxide layer making contact with the upper light absorption layer, and an intermediate copper oxide layer between the lower copper oxide layer and the upper copper oxide layer. Oxygen amount may gradually decrease from the upper copper oxide layer to the lower copper oxide layer.

In much further embodiments, the intermediate reflector layer may have refractive index from about 2.0 to about 3.0.

The silicon solar cell according to an embodiment of the inventive concept includes an intermediate reflector layer formed by using a copper oxide compound between a lower light absorption layer and an upper light absorption layer so that the lower light absorption layer and the upper light absorption layer may effectively absorb lights having different wavelength ranges. Thus, the efficiency of the solar cell may be improved.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1:
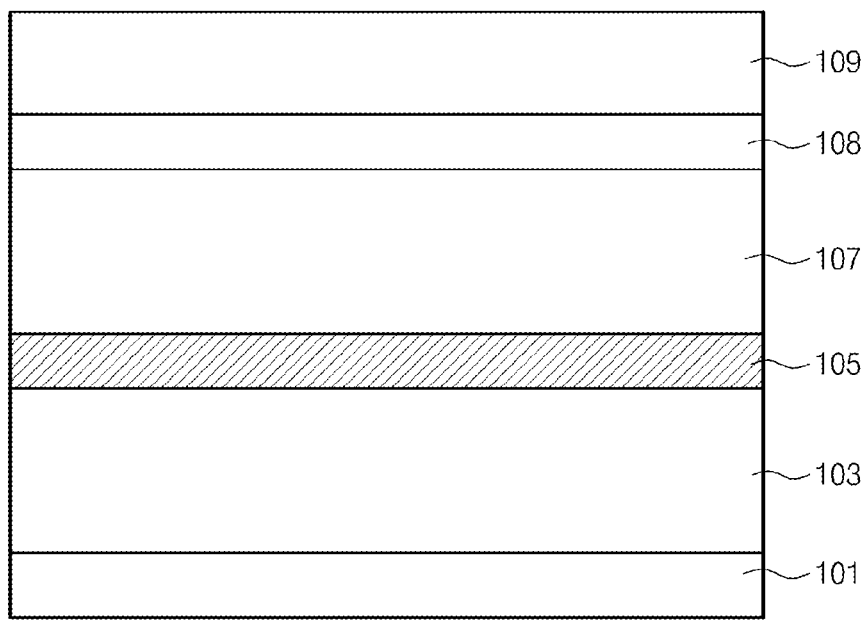
FIG. 1 is a cross-sectional view of a silicon solar cell according to an embodiment of the inventive concept.

The advantages and the features of the inventive concept, and methods for attaining them will be described in example embodiments below with reference to the accompanying drawings. The inventive concept may, however, be embodied in different forms and should not be construed as limited to the embodiments set forth herein. Rather, these embodiments are provided so that this description will be thorough and complete, and will fully convey the scope of the present inventive concept to those skilled in the art. Like reference numerals refer to like elements throughout.

The terminology used herein is for the purpose of describing particular example embodiments only and is not intended to limit the present inventive concept. As used herein, the singular forms are intended to include the plural forms as well, unless the context clearly indicates otherwise. It will be further understood that the terms "comprises" and/or "comprising," when used in this specification, specify the presence of stated features, steps, operations, and/or devices, but do not preclude the presence or addition of one or more other features, steps, operations, and/or devices thereof. In addition, example embodiments are described herein with reference to cross-sectional views and/or plan views that are schematic illustrations of idealized example embodiments. In the drawings, the sizes and relative sizes of layers and regions may be exaggerated for effective explanation of technical contents. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, a region illustrated as a rectangle will, typically, have rounded or curved features. Thus, the regions illustrated in the figures are schematic in nature and their shapes are not intended to illustrate the actual shape of a region of a device and are not intended to limit the scope of the present inventive concept.

FIG. 1 is a cross-sectional view of a silicon solar cell according to an embodiment of the inventive concept.

Referring to FIG. 1, a silicon solar cell includes a first electrode 101, a lower light absorption layer 103, an intermediate reflector layer 105, an upper light absorption layer 107 and a second electrode 108.

On the first electrode 101, the lower light absorption layer 103 is disposed. The first electrode 101 may include at least one material selected from the group consisting of molybdenum (Mo), aluminum (Al), silver (Ag), gold (Au), platinum (Pt), copper (Cu) and nickel (Ni). The first electrode 101 may play the role of reflecting the absorbed light toward the lower light absorption layer 103 so as to block the loss of the light to the outside.

The lower light absorption layer 103 may include a silicon material.

The lower light absorption layer 103 may include, for example, amorphous silicon, microcrystalline silicon, amorphous silicon germanium, or microcrystalline silicon germanium. The lower light absorption layer 103 may have a smaller energy band gap than the upper light absorption layer 107 and may absorb light having a long wavelength.

The upper light absorption layer 107 may be disposed on the lower light absorption layer 103. The upper light absorption layer 107 may include a silicon material. The upper light absorption layer 107 may include, for example, amorphous silicon, amorphous silicon germanium, amorphous silicon oxide ($SiO_x$). The upper light absorption layer 107 may have a greater energy band gap than the lower light absorption layer 103 and may absorb light having a short wavelength.

The intermediate reflector layer 105 is provided between the lower light absorption layer 103 and the upper light absorption layer 107. The intermediate reflector layer 105 may reflect light having a short wavelength and may transmit light having a long wavelength. The intermediate reflector layer 105 may include a copper oxide compound (for example, $CuO$, $Cu_2O$, and $CuO_x$, where x is a real number from 0.1 to 2).

The copper oxide compound may change the refractive index, the electric conductivity and the type of the electric conductivity of the copper oxide compound by adjusting the oxygen amount in the copper oxide compound. Generally, the resistance and the transmittance of the copper oxide compound may increase as the oxygen amount increases, and the resistance and the transmittance of the copper oxide compound may decrease as the oxygen amount decreases.

Meanwhile, the transmittance and the electric conductivity of the copper oxide compound may be controlled by forming the intermediate reflector layer 105 into a thin film while maintaining the function of the intermediate reflector layer 105. The intermediate reflector layer 105 may have a thickness from about 1 angstrom to about 100 nm. The intermediate reflector layer 105 may have refractive index from about 2.0 to about 3.0.

The amount of oxygen of the copper oxide compound may be adjusted according to deposition methods and processing conditions. The intermediate reflector layer 105 may be formed by using a physical vapor deposition (PVD) method, a chemical vapor deposition (CVD) method, a sputtering deposition method, an atomic layer deposition (ALD) method, a sol-gel method, an oxidation process or a pulse-laser deposition (PLD) method.

The second electrode 108 is disposed on the upper light absorption layer 107. The second electrode 108 may be formed by using a material having high light transmittance and high electric conductivity so as to play the role of a window of the solar cell. The second electrode 108 may include, for example, a transparent conductive oxide (for example, tin oxides, indium oxides and zinc oxides).

On the second electrode 108, a transparent substrate 109 is disposed. The transparent substrate 109 may include a soda-lime glass or a corning glass.

Light penetrates the transparent substrate 109 and is absorbed by the upper light absorption layer 107 and the lower light absorption layer 103, thereby being transformed into electricity. In this case, the upper light absorption layer 107 and the lower light absorption layer 103 have different energy band gaps, and the upper light absorption layer 107 and the lower light absorption layer 103 absorb different lights having different wavelength ranges, respectively.

To effectively absorb the lights having different wavelength ranges by the lower and upper light absorption layers 103 and 107, the intermediate reflector layer 105 formed by using the copper oxide compound may be used. The intermediate reflector layer 105 reflects light having a short wavelength so that the light having the short wavelength and penetrating the upper light absorption layer 107 may be re-absorbed by the upper light absorption layer 107, while transmitting the light having a long wavelength to deliver the light having the long wavelength to the lower light absorption layer 103. Thus, the efficiency of the solar cell may be improved.

Figure 2:
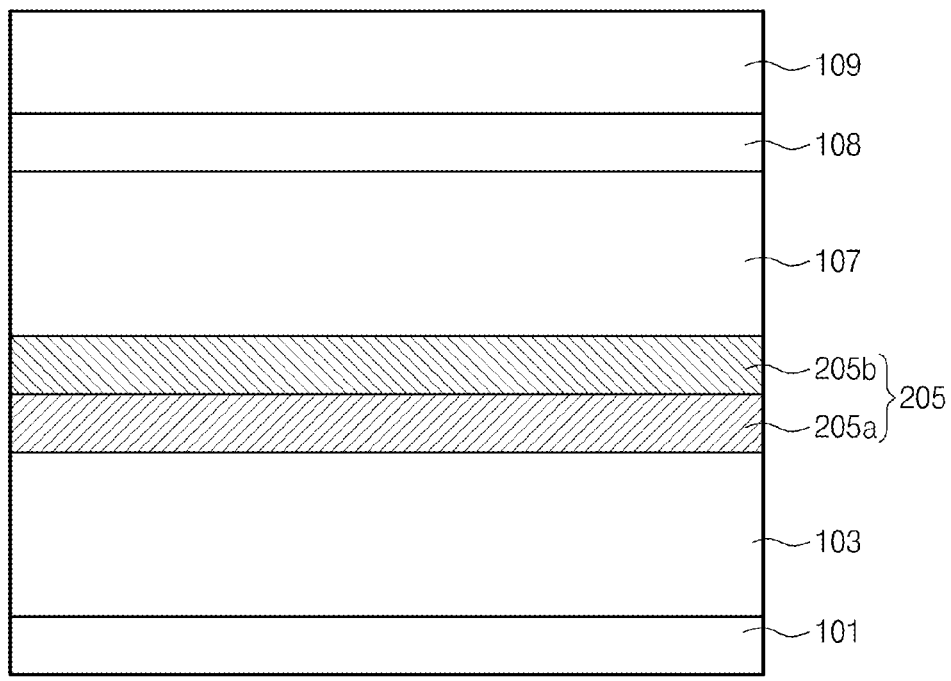
FIG. 2 is a cross-sectional view of a silicon solar cell according to another embodiment of the inventive concept.

FIG. 2 is a cross-sectional view of a silicon solar cell according to another embodiment of the inventive concept. For brevity of explanation, the same reference symbols in the above-described embodiment are used for substantially the same elements in another embodiment in FIG. 2, and explanation thereon will be omitted.

Referring to FIG. 2, an intermediate reflector layer 205 is provided between the lower light absorption layer 103 and the upper light absorption layer 107, and includes a first intermediate reflector layer 205a and a second intermediate reflector layer 205b stacked one by one.

The first intermediate reflector layer 205a may include silicon (Si), silicon germanium (SiGe), silicon oxide ($SiO_x$), silicon carbide ($SiC_x$), silicon nitride ($SiN_x$), zinc oxide (ZnO), indium tin oxide (ITO), ZnO:Ga, ZnO:Al, copper (Cu), aluminum (Al), and silver (Ag).

The second intermediate reflector layer 205b may include a copper oxide compound (for example, CuO, $Cu_2O$, and $CuO_x$, where x is a real number from 0.1 to 2). The second intermediate reflector layer 205b may have a thickness from about 1 angstrom to about 100 nm The second intermediate reflector layer 205b may have refractive index from about 2.0 to about 3.0.

The refractive index of the first intermediate layer 205a may be greater or smaller than the refractive index of the second intermediate layer 205b. The intermediate reflector layer 205 including the double layer having different refractive index may more effectively transmit the light having a desired wavelength range toward the lower light absorption layer 103 or reflect toward the upper light absorption layer 107 when compared to the intermediate reflector layer having a single layer.

Figure 3:
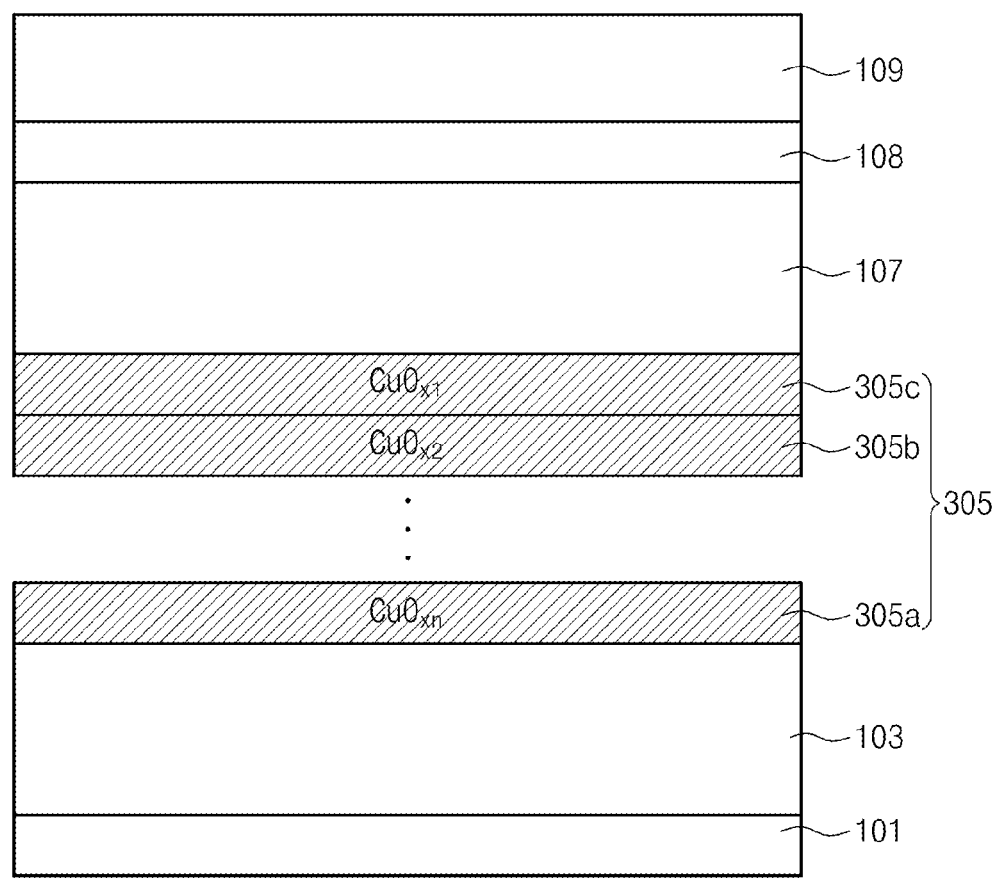
FIG. 3 is a cross-sectional view of a silicon solar cell according to further another embodiment of the inventive concept.

FIG. 3 is a cross-sectional view of a silicon solar cell according to further another embodiment of the inventive concept. For brevity of explanation, the same reference symbols in the above-described embodiment are used for substantially the same elements in another embodiment in FIG. 3, and explanation thereon will be omitted.

Referring to FIG. 3, an intermediate reflector layer 305 may include a plurality of copper oxide layers 305a, 305b and 305c. A lower copper oxide layer 305a makes direct contact with the lower light absorption layer 103, and An upper copper oxide layer 305c may make direct contact with the upper light absorption layer 107. Between the lower copper oxide layer 305a and the upper copper oxide layer 305c, an intermediate copper oxide layers 305b may be disposed. The oxygen amount included in each of the upper, the intermediate and the lower copper oxide layers 305a, 305b and 305c may be different. For example, the oxygen amount of the intermediate reflector layer 305 may gradually increase from the upper copper oxide layer 305c to the lower copper oxide layer 305a ($X_1<X_2<X_3$). Alternatively, the oxygen amount of the intermediate reflector layer 305 may gradually decrease from the upper copper oxide layer 305c to the lower copper oxide layer 305a ($X_1>X_2>X_3$). Through controlling the amount of oxygen in each of the plurality of copper oxide layers 305a, 305b and 305c, the light having a desired wavelength range may be transmitted toward the lower light absorption layer 103 or may be reflected toward the upper light absorption layer 107.

Figure 4:
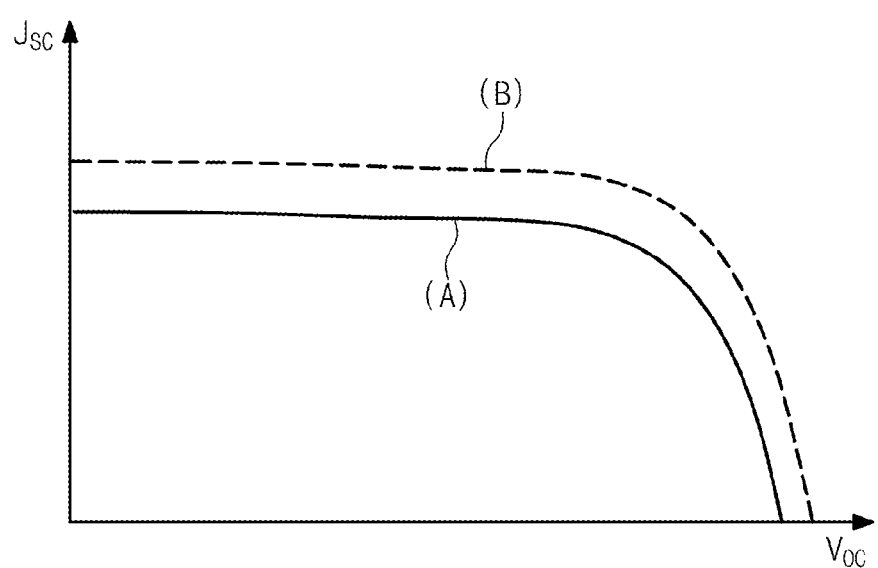
FIG. 4 is a graph illustrating short circuit current-open circuit voltage properties of a silicon solar cell using an intermediate reflector layer including copper oxide according to embodiments of the inventive concept.

FIG. 4 is a graph illustrating short circuit current-open circuit voltage properties of a silicon solar cell using an intermediate reflector layer including copper oxide according to embodiments of the inventive concept.

Referring to FIG. 4, (A) corresponds to the short circuit current-open circuit voltage properties of a silicon solar cell excluding an intermediate reflector layer including copper oxide, and (B) corresponds to the short circuit current-open circuit voltage properties of a silicon solar cell including an intermediate reflector layer including copper oxide.

The short circuit current and the open circuit voltage for (B) are greater than (A), and the efficiency of the solar cell obtained by multiplying the value of the short circuit current and the value of the open circuit voltage of a silicon solar cell including the intermediate reflector layer of the copper oxide is greater than that of a silicon solar cell excluding the intermediate reflector layer.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A solar cell, comprising:
    a first electrode;
    a lower light absorption layer disposed on the first electrode;
    an upper light absorption layer disposed on the lower light absorption layer; and
    an intermediate reflector layer provided between the lower light absorption layer and the upper light absorption layer, the intermediate reflector layer being comprised of copper oxide,
    wherein the intermediate reflector layer includes a plurality of copper oxide layers including a lower copper oxide layer making contact with the lower light absorption layer, an upper copper oxide layer making contact with the upper light absorption layer, and an intermediate copper oxide layer provided between the lower copper oxide layer and the upper copper oxide layer, and
    wherein the plurality of copper oxide layers have respective oxygen amounts that gradually increase from the upper copper oxide layer to the lower copper oxide layer.

2. The solar cell of claim 1, wherein the intermediate reflector layer has a refractive index ranging from about 2.0 to about 3.0.

3. The solar cell of claim 1, wherein the copper oxide includes CuO, $Cu_2O$ or $CuO_x$, where x is a real number from 0.1 to 2.

4. The solar cell of claim 1, wherein the intermediate reflector layer has a thickness ranging from about 1 angstrom to about 100 nm.

5. The solar cell of claim 1, wherein the intermediate reflector layer reflects light having a short wavelength so that the upper light absorption layer re-absorbs transmitted light having the short wavelength through the upper light absorption layer, and the intermediate reflector layer selectively transmits light having a long wavelength so as to provide the light having the long wavelength to the lower light absorption layer.

6. A solar cell, comprising:
    a first electrode;
    a lower light absorption layer disposed on the first electrode;
    an upper light absorption layer disposed on the lower light absorption layer; and
    an intermediate reflector layer provided between the lower light absorption layer and the upper light absorption layer, the intermediate reflector layer being comprised of copper oxide,
    wherein the intermediate reflector layer includes a plurality of copper oxide layers including a lower copper oxide layer making contact with the lower light absorption layer, an upper copper oxide layer making contact with the upper light absorption layer, and an intermediate copper oxide layer between the lower copper oxide layer and the upper copper oxide layer, and wherein the copper oxide layers have respective oxygen amounts that gradually decrease from the upper copper oxide layer to the lower copper oxide layer.

* * * * *